United States Patent [19]
Kinzer

[11] Patent Number: 5,879,968
[45] Date of Patent: Mar. 9, 1999

[54] PROCESS FOR MANUFACTURE OF A P-CHANNEL MOS GATED DEVICE WITH BASE IMPLANT THROUGH THE CONTACT WINDOW

[75] Inventor: Daniel M. Kinzer, El Segundo, Calif.

[73] Assignee: International Rectifier Corporation, El Segundo, Calif.

[21] Appl. No.: 946,984

[22] Filed: Oct. 8, 1997

[51] Int. Cl.[6] ............................................. H01L 21/332
[52] U.S. Cl. ........................................................... 438/135
[58] Field of Search .................................... 438/135, 138, 438/268, 269, 270, 271, 272, 273

[56] References Cited

U.S. PATENT DOCUMENTS

| 4,879,254 | 11/1989 | Tsuzuki et al. | 438/273 |
|---|---|---|---|
| 4,898,835 | 2/1990 | Cawlfield | 438/273 |
| 4,987,098 | 1/1991 | Nishiura et al. | 438/138 |
| 5,023,191 | 6/1991 | Sakurai | 438/527 |
| 5,072,266 | 12/1991 | Bulucea et al. | 257/330 |
| 5,164,327 | 11/1992 | Maruyama | 438/273 |
| 5,298,442 | 3/1994 | Bulucea et al. | 438/270 |
| 5,453,390 | 9/1995 | Nishizawa et al. | 438/138 |
| 5,486,715 | 1/1996 | Zommer | 438/275 |

FOREIGN PATENT DOCUMENTS

| 0150365 | 8/1985 | European Pat. Off. . |
| 0646959 | 9/1993 | European Pat. Off. . |
| 0744769 | 5/1996 | European Pat. Off. . |
| 60-21571 | 2/1985 | Japan . |
| WO9607200 | 7/1996 | WIPO . |

OTHER PUBLICATIONS

A High Density Self–Aligned 4–Mask Planar VDMOS Process, D. Kinzer, J.S. Ajit, K. Wagner, D. Asselanis, Proceedings Of The 8th International Symposium On Power Semiconductor Devices and IC's )ISPSD), Maui, Hawaii, May 20–23, 1996, pp. 243–246, XP000598423, Salama C A T; Williams R K (Eds) p. 244, Colonne De Gauche; Figure 1.

Primary Examiner—Charles Bowers
Assistant Examiner—Craig Thompson
Attorney, Agent, or Firm—Ostrolenk, Faber, Gerb & Soffen, LLP

[57] ABSTRACT

An MOS-gated power semiconductor device is formed by a process that uses a reduced number of masking steps and minimizes the number of critical alignments. A first photolithographic masking step defines the body or channel region and the source region of each of the cells. A second photolithographic step is aligned to a small central area above the source region of each of the cells or strips, the only critical alignment in the process, and is used to define openings in a protective oxide layer which, in turn, masks the etching of depressions in the substrate surface and the formation of a contact region. An isotropic etch undercuts the protective oxide to expose shoulders at the silicon surface of the chip which surround the etched holes. A conductive layer fills the holes and thus contacts the underlying body regions and overlaps the shoulders surrounding the source regions at the silicon surface. The conductive layer is sintered at a temperature that is sufficiently high to achieve low contact resistance between the metal and body regions but is low enough to be tolerated by the conductive layer.

14 Claims, 3 Drawing Sheets

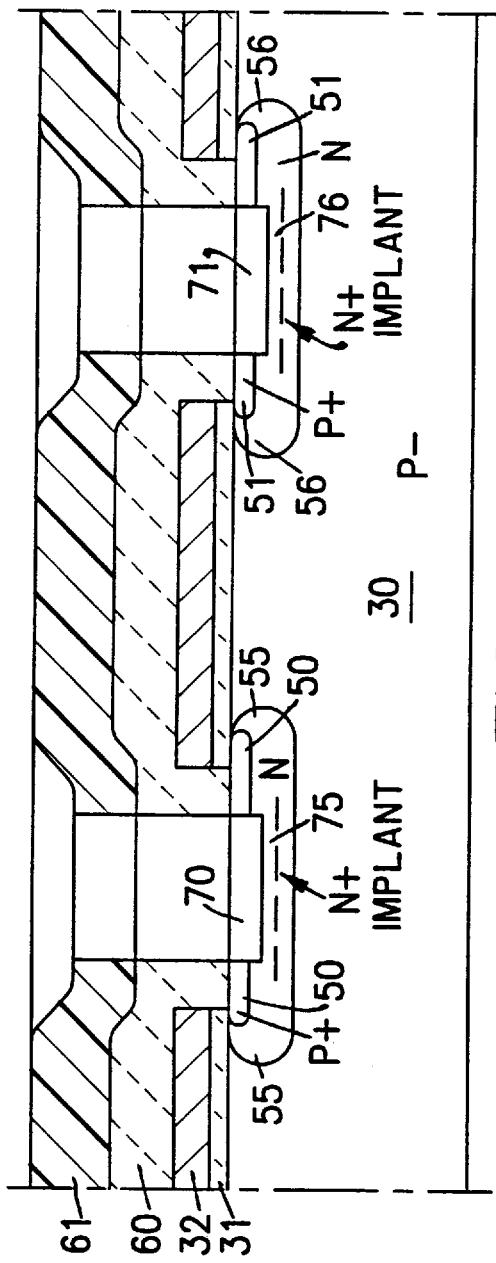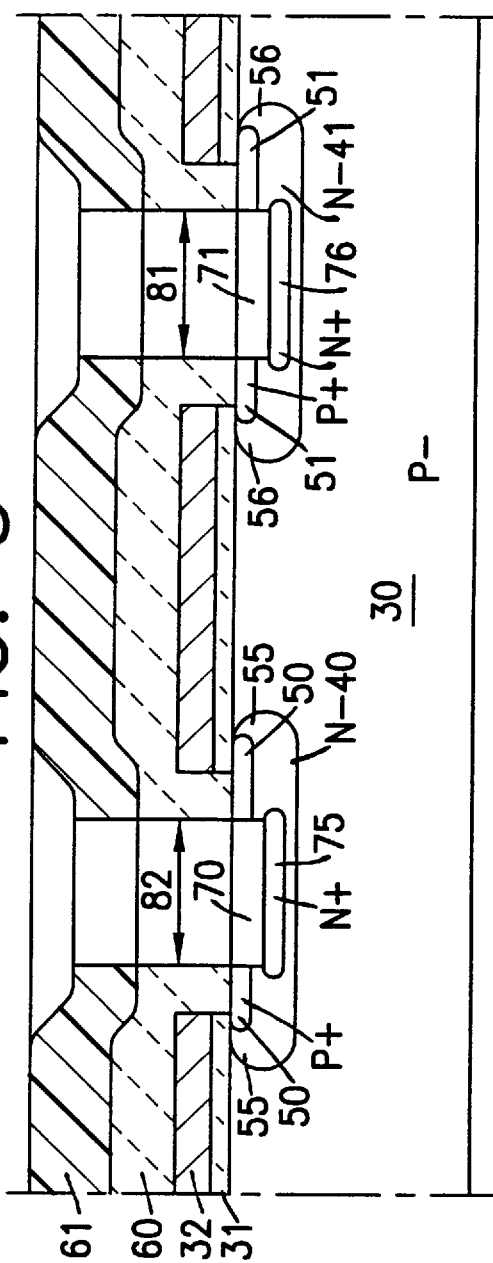

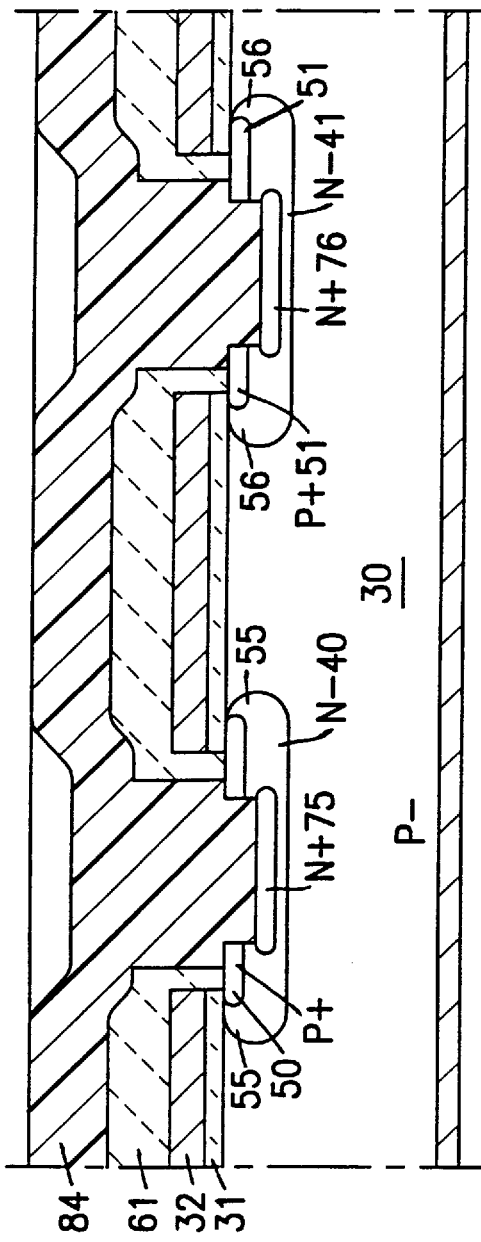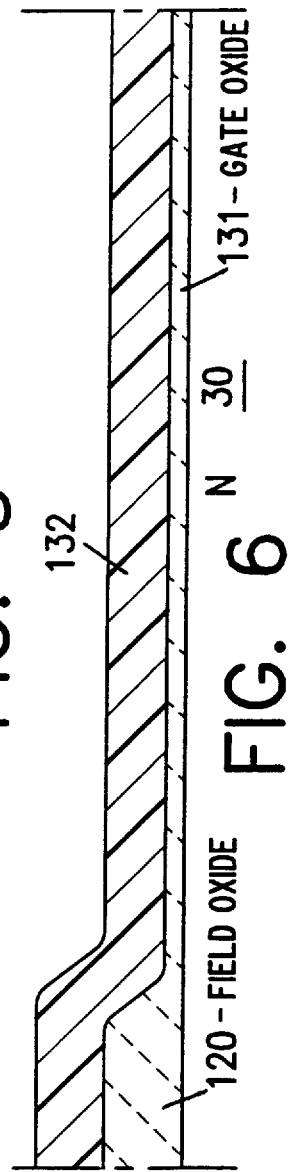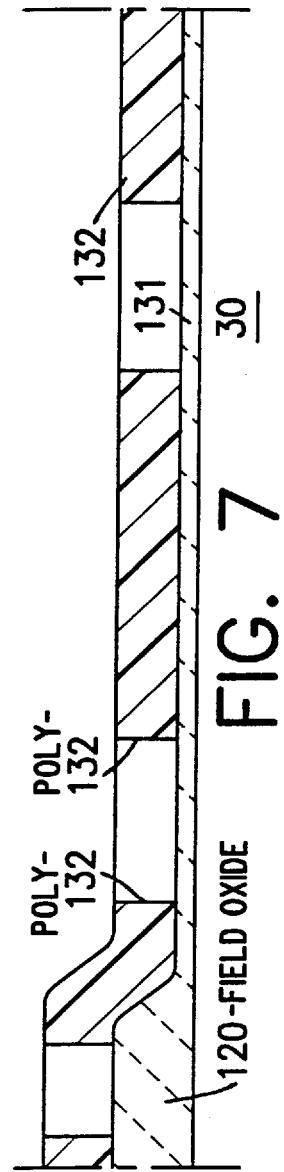

5,879,968

PROCESS FOR MANUFACTURE OF A P-CHANNEL MOS GATED DEVICE WITH BASE IMPLANT THROUGH THE CONTACT WINDOW

RELATED APPLICATIONS

This application claims the priority of Provisional Application Ser. No. 60/031,051, filed Nov. 18, 1996.

BACKGROUND OF THE INVENTION

The present invention relates to semiconductor devices and, more specifically, to MOS gate controlled reference (MOS-gated) semiconductor devices formed using a reduced number of masking steps with only a minimal number of critical alignments.

MOS-gated devices are well-known in the art and include devices such as the MOS-gated devices described in U.S. Pat. No. 5,795,793, issued Aug. 18, 1998. These devices include power MOSFETs, MOS-gated thyristors, insulated gate bipolar transistors (IGBTs), gate turn-off devices and the like.

The manufacturing processes for such devices typically include a number of lithographic masking steps which include critical mask alignment steps. Each of these critical alignment steps add manufacturing time and expense as well as provide possible sources of device defects.

It is therefore desirable to minimize the number of critical alignments necessary as well as reduce the number of masking steps to improve the manufacturing yield and reduce the manufacturing cost.

SUMMARY OF THE INVENTION

The present invention provides a novel process for the manufacture of P-channel MOS-gated power devices by forming P-channel device cells using only three or four mask steps with only one critical alignment at the contact mask step.

A gate oxide layer and a polysilicon layer are formed atop a P- silicon substrate. A first photolithographic masking step defines an N-type body or channel region of each of the cells or strips of the device as well as a P+ source region disposed within the N-type body region of the MOSFET cell.

A second photolithographic masking step is then employed which is aligned to a small central area above the P+ regions of each of the cells or strips of the device. An anisotropic oxide etch forms openings in a protective oxide layer covering the device which reach the surface of the silicon. An anisotropic silicon etch follows which causes a shallow hole in the surface of the silicon centered on the P+ regions. The hole is deep enough to cut through the P+ regions and reach the underlying N-type channels or body regions. The alignment of the second mask, which is the contact mask, is the only critical alignment in the process.

A heavy base contact implant is carried out through the contact window after the hole has been etched in the silicon but before metal is deposited on the wafer. This heavy base contact implant is then followed by an isotropic etch which undercuts the protective oxide above the gate oxide to expose shoulders at the silicon surface of the chip which surround the etched openings into the N+ cell regions.

Thereafter, a conductive layer, which may be metal, is deposited over the surface and fills the holes through the P+ region, thereby contacting the underlying N body regions and overlaps the shoulders surrounding the P+ source regions at the silicon surface. Consequently, a good contact is made to the P+ source and to the underlying N region. Note that this contact between the N underlying body region and the P+ source region is desirable in order to short circuit the parasitic transistor which inherently appears in each cell structure of a MOS gated device.

A third mask is used to pattern the metal, followed by a sinter and backside metallization. No anneal is required prior to metallization because the sinter temperature is sufficiently high to activate enough dopant to achieve low contact resistance between the metal and body regions but is low enough to be tolerated after the metal is deposited.

Other features and advantages of the present invention will become apparent from the following description of the invention which refers to the accompanying drawings.

BRIEF DESCRIPTION OF THE DRAWINGS

FIG. 3 shows the structure of FIG. 2 after an N+ implant into the openings in the silicon;

FIG. 4 shows the structure of FIG. 3 following an isotropic etch which undercuts the LTO layer; and FIG. 5 shows the structure of FIG. 4 following the stripping of the second photoresist layer and the deposition of a source contact metal layer.

FIG. 6 is a cross sectional view of another embodiment of the present invention showing a portion of a chip after a field oxide layer has been formed thereon and patterned, and after the subsequent deposition of a gate oxide layer and a polysilicon layer.

FIG. 7 shows the structure of FIG. 6 after the patterning and etching of the polysilicon layer.

DETAILED DESCRIPTION OF THE INVENTION

The following description of the preferred embodiments of the invention describes the manufacture of a P channel power MOSFET device. However, any suitable modification to the junctions can be employed to use the same process for the manufacture of other P channel MOS-gated devices, such as an IGBT or a MOS-gated thyristor.

The topology of the devices is preferably that of hexagonal cells. However, it will be apparent to those skilled in the art that the process is equally applicable to cells having any polygonal structure such as square or rectangular cells, whether offset or in a line, as well as to interdigitated structures.

Figure 1:
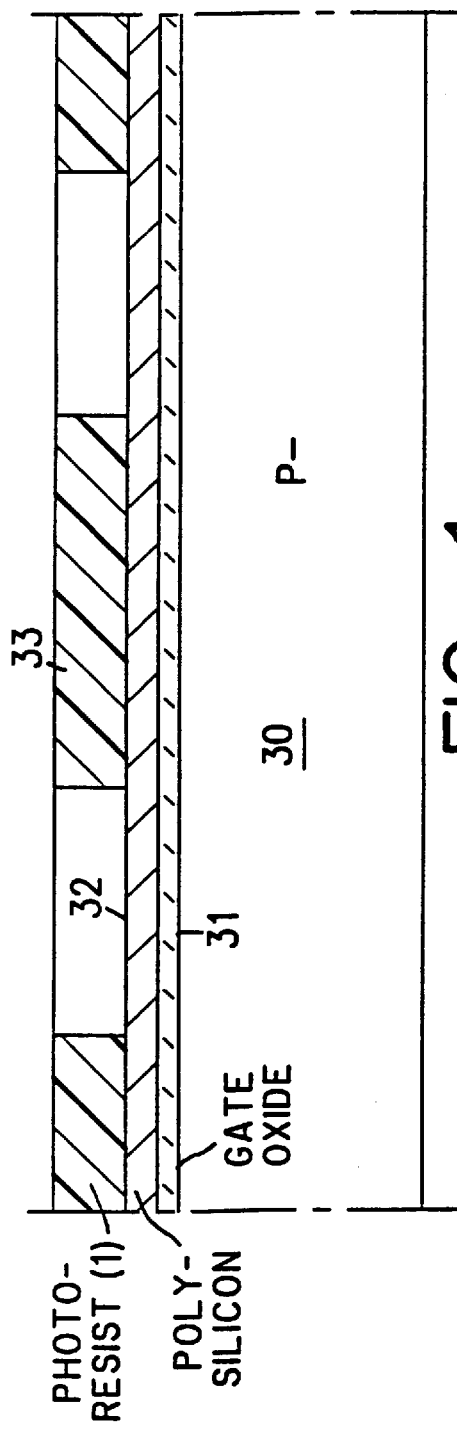
FIG. 1 is a cross-sectional view of a portion of a chip within a silicon wafer after a gate oxide layer and a polysilicon layer have been formed thereon and after a first photoresist layer is deposited atop the polysilicon layer and patterned.

Referring first to FIG. 1, there is shown a portion of a wafer or chip which has a repetitive structure. Only a few of the elements are shown in cross-section. The wafer may be of any desired size and will be diced into a plurality of chips. In this description, the terms "chip" and "wafer" are sometimes interchanged.

FIG. 1 shows a wafer having an P- body 30 formed of monocrystalline silicon. Preferably, the P-body 30 is an epitaxially formed layer grown atop a P+ substrate (not shown). A drain (or anode) contact may be connected to the P+ substrate and may be available for connection at either surface of the chip.

The first step in the process of the invention is the formation of an insulation layer 31 atop the P-body 30. The insulation layer 31 may be thermally grown silicon dioxide and may have a thickness of from 100 to 1,500 angstroms.

A layer of polysilicon 32 is then deposited atop the oxide layer 31 and has a thickness of, for example, of 7500 angstroms. The polysilicon layer may be formed in any desired manner but, preferably, is deposited and then heavily doped with implanted arsenic or by a subsequent CVD doping step.

After the deposition of the polysilicon layer 32, a suitable first photoresist layer 33 is then formed atop the polysilicon layer and patterned by an appropriate photolithographic mask step to form openings in the photoresist to the surface of the polysilicon layer 32. The polysilicon layer is then etched by a subsequent anisotropic etch which forms corresponding openings down to the gate oxide layer shown in FIG. 2. Preferably, the polysilicon side walls should be as nearly vertical as possible to accurately define the subsequent implant steps.

Thereafter, the underlying exposed gate oxide layer may be removed with an isotropic wet etch or with an anisotropic etch. However, it is also possible to leave the gate oxide intact at this step and then do the subsequent implant steps with a sufficiently high energy to penetrate the thin gate oxide.

The above anisotropic and isotropic etches used are well-known to those of ordinary skill in the art and any appropriate etch process can be selected for these steps.

Thereafter, the photoresist layer is stripped, and a relatively light dose of arsenic or phosphorus is implanted through the openings in the polysilicon layers and into the exposed silicon. Following the implant, the N type implants are driven in to form channel regions 40 and 41. The values of the implant dose and energy and the drive time and temperature are determined based on the desired depth and distribution of the channel regions as would be known in the art.

A relatively high P+ dose of boron is then implanted through the openings in the polysilicon layer to subsequently form the source regions 50 and 51. A diffusion step may then follow.

Figure 2:
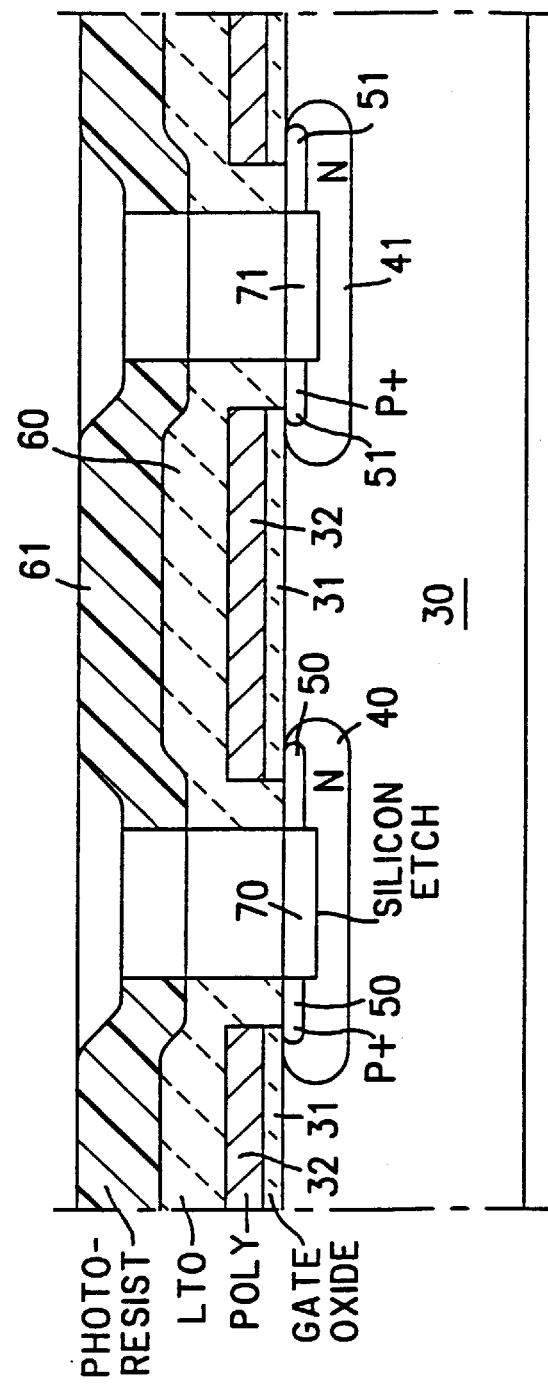
FIG. 2 shows the structure of FIG. 1 after openings have been formed in the gate oxide and polysilicon layers, lightly doped N regions and P+ regions have been formed in the openings, a low temperature oxide (LTO) layer deposited, a second photoresist layer deposited and patterned, the LTO layer etched, and an the silicon anisotropically etched to form a depression through the P+ region.

Thereafter, and as shown in FIG. 2, a layer of low temperature oxide (LTO) 60 is deposited atop the surface of the wafer at a thickness of about 6,000 to 8,000 angstroms. After the deposition of the LTO layer 60, the P+ region 50 and 51 are driven in. The values at the P+ implant energy and dose and its drive time and temperature are also selected to attain a shallower depth than and be surrounded by the N-type channel regions. By doing the drive after the deposition of the LTO layer 60, the LTO layer will also densify under the drive conditions.

It will be noted that this operation has produced annular channel regions 55 and 56 for the two cells which are shown. These channel regions underlie respective segments of the polysilicon layer 32, which defines the polysilicon gate for each cell, and are invertible upon the connection of a gate potential to the polysilicon layer 32. The polysilicon layer 32 will have a lattice configuration between the cells if the cells are of a polygonal structure. This lattice will, at its sides or edges, overlie the underlying channel regions within the cells.

Thereafter, and as shown in FIG. 2, a second photoresist layer 61 is applied atop the LTO layer 60 and is patterned by a second mask step to form well aligned small central openings which are located at the axis of each of the individual cells or along the length of strips if an interdigitated geometry is used. This is the only critical alignment step in the process. If a cellular structure is used, the openings in the photoresist 61 have a diameter of about 1.5–2 microns. This dimension depends on the photolithography process and metal-silicon contact system. After the formation of the openings in the photoresist, the LTO layer 60 is etched by an anisotropic oxide etch to open a central opening which reach the silicon surface.

Then, another anisotropic etch into the exposed silicon surface forms holes 70, 71 that penetrate the P+ regions 50, 51 and reach the N regions 40, 41 for each cell. Because of the LTO layer, the holes or depressions formed in the silicon surface have a smaller diameter than that of the openings in the polysilicon.

Thereafter, as FIG. 3 shows, a dose of 5E14 or greater of arsenic or phosphorus is implanted into the silicon substrate exposed by the etching of the holes to form N+ base regions 75, 76 in the N type regions 40, 41. The implant is carried out at an energy of about 80 keV.

Thereafter, and as shown in FIG. 4, the silicon wafer is exposed to an isotropic wet etch which undercuts the LTO and gate oxide, if present, back to diameters 82 and 83. The etch exposes, for a hexagonal or polygonal cell, a shoulder of the surface of the silicon chip which extends around openings 70 and 71.

In a preferred embodiment of the invention, the wet etch forming the undercut in the LTO and gate oxide is a wet 6 to 1 buffered oxide etch for 1–5 minutes. This wet etch creates a shoulder of about 0.1–0.5 microns in width, which is sufficient to make a low resistance contact to the source region.

Thereafter, and as seen in FIG. 5, the photoresist 61 is stripped and a source contact metal 84, such as aluminum is deposited over the full surface of the device. The contact metal will fill in the openings 70 and 71 and will overlie the exposed silicon shoulders formed by the undercuts 82 and 83 in FIGS. 9 and 10. Thus the source metal 84 automatically connects the underlying N regions 40, 41 to the P+ regions 50, 51 to make the intentional short between the N and the P+ regions in each cell.

After its deposition, the metal layer 84 is then sintered at about 425°–450° C. The temperature of the sinter is sufficiently high to activate enough of the dopants in the N+ base regions 75, 76 so that no anneal is needed after the N+ base implant. The sinter temperature is also low enough to be tolerated by the deposited metal layer 84.

A third photoresist layer (not shown) may then be applied atop the contact metal layer and is patterned by a third photolithographic step to define a gate bus and the source contact electrode. The alignment of the third photolithographic step to the wafer is not critical. After the photoresist layer is patterned, the metal layer may then be etched by an anisotropic etch.

A drain (or anode) contact 90 may also be connected to the substrate and may be available for connection at either surface of the chip. If the device is an IGBT, a thin P+ buffer layer and N+ bottom layer is included in the bottom of a wafer structure in the conventional manner.

According to an alternative aspect of the invention, a field oxide layer 120, shown in FIGS. 6 and 7, may be formed atop the P- body 30 prior to the formation of the gate oxide layer. A photoresist layer is deposited atop the field oxide and then patterned as an initial photolithographic mask step to form openings in the field oxide layer. The exposed portions of the field oxide are then etched away to expose the active device areas. The gate oxide insulation layer 131 is then grown atop the active device areas, and the polysilicon layer 132 is then deposited over the gate oxide and field oxide layers. Openings are then formed in both the polysilicon that is atop the gate oxide insulation layer as well as in the polysilicon atop the gate oxide. The device may then be processed in the manner described above.

In this embodiment, the etching of the metal layer also forms a gate bus which contacts the polysilicon atop the field oxide.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a semiconductor device, said process comprising the steps of:

forming a layer of gate insulation material atop a silicon substrate of one conductivity type;

depositing a layer of polysilicon atop said layer of gate insulation material;

patterning and etching away selected regions of said polysilicon layer to form a plurality of spaced openings therein;

introducing impurities of another conductivity type, which is of opposite conductivity type to said one conductivity type, into surface regions of said silicon substrate located beneath said openings in said layer of polysilicon to form first diffused regions;

introducing impurities of said one conductivity type into said surface regions of said silicon substrate to form second diffused regions;

depositing an overlaying insulation layer at least atop said polysilicon layer and in said openings in said layer of polysilicon;

patterning and etching away portions of said overlaying insulation layer, thereby leaving a remaining portion of said overlaying insulation layer that forms vertical sidewall spacers along sidewalls in each of said openings in said layer of polysilicon and which exposes a centrally located portion of each of said surface regions of said silicon substrate and another remaining portion atop said layer of polysilicon;

etching depressions in said portion of said surface regions of said silicon substrate to a depth greater than the depth of said second diffused regions;

introducing impurities of said another conductivity type into said portion of said surface regions of said silicon substrate to form third diffused regions; said second diffused regions having a final depth that is less than that of said third diffused regions and a final width that is wider than that of said third diffused regions, said first diffused regions extending deeper and wider than and having a lower concentration than that of said third diffused regions;

etching said sidewall spacers to form undercut portions in said overlaying insulation layer that expose further portions of said surface regions of said silicon substrate which surround said depressions;

depositing a conductive layer;

patterning and etching away portions of said conductive layer to form at least one source contact, which contacts said second diffused regions at upper regions of said depressions and contacts said third diffused regions at the bottom of said depressions, and at least one gate contact.

2. The process of claim 1 wherein said steps of introducing impurities of said one and another conductivity types includes implanting said impurities into said silicon substrate through said layer of gate insulation material.

3. The process of claim 1 wherein said step of introducing impurities of said one conductivity type includes etching away portions of said gate insulation material located beneath said openings in said polysilicon layer, and then implanting said impurities into said surface regions of said silicon substrate.

4. The process of claim 1 wherein said step of patterning and etching away selected regions of said polysilicon layer includes a first lithographic masking step.

5. The process of claim 4 wherein said step of patterning and etching away portions of said overlaying insulation layer includes a second photolithographic masking step that is aligned to said first lithographic masking step.

6. The method of claim 1 wherein said step of etching sidewall spacers is an isotropic wet etch which undercuts said overlaying insulation layer.

7. The process of claim 1 wherein said one conductivity type is P-type and said other conductivity type is N-type.

8. The process of claim 1 wherein said overlaying insulation layer consists of a single oxide layer.

9. The process of claim 1 further comprising the step of thermally treating said conductive layer by sintering said conductive layer at about 425°–450° C.

10. The process of claim 9 wherein said sintering activates said impurities of said third diffused regions.

11. The process of claim 1 further comprising the step of depositing a further conductive layer on a bottom surface of said silicon substrate which comprises a further contact.

12. The process of claim 1 further comprising the steps of: forming a layer of field insulation material atop said silicon substrate; and patterning and etching away at least one selected region of said layer of field insulation material to form at least one opening in said layer of field insulation material and at least one remaining portion; wherein said layer of gate insulation material is formed atop said silicon substrate in said at least one opening in said layer of field insulation material, said layer of polysilicon is deposited atop said remaining portion of said layer of field insulation material and atop said layer of gate insulation material, and said selected regions of said first overlaying insulation layer are etched away to form a plurality of first spaced openings therein which are atop said layer of gate insulation material and a plurality of second spaced openings therein which are atop said layer of field insulation material.

13. The process of claim 12 wherein said one conductivity type is P-type and said another conductivity type is N-type.

14. The process of claim 12 wherein said step of patterning and etching away portions of said conductive layer includes forming a gate bus which contacts a portion of said layer of polysilicon that is atop said layer of field insulation material.

* * * * *